(12) United States Patent
Kagawa et al.

(10) Patent No.: US 11,521,800 B2
(45) Date of Patent: Dec. 6, 2022

(54) CAPACITOR

(71) Applicant: Murata Manufacturing Co., Ltd., Nagaokakyo (JP)

(72) Inventors: Takeshi Kagawa, Nagaokakyo (JP); Junko Izumitani, Nagaokakyo (JP); Masatomi Harada, Nagaokakyo (JP); Nobuhiro Ishida, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 77 days.

(21) Appl. No.: 16/385,552

(22) Filed: Apr. 16, 2019

(65) Prior Publication Data

US 2019/0244761 A1    Aug. 8, 2019

Related U.S. Application Data

(63) Continuation of application No. PCT/JP2017/037518, filed on Oct. 17, 2017.

(30) Foreign Application Priority Data

Nov. 2, 2016 (JP) .............................. JP2016-215106

(51) Int. Cl.
*H01G 4/33* (2006.01)
*H01G 4/228* (2006.01)
(Continued)

(52) U.S. Cl.
CPC .............. *H01G 4/33* (2013.01); *H01G 4/012* (2013.01); *H01G 4/12* (2013.01); *H01G 4/228* (2013.01); *H01L 21/822* (2013.01); *H01L 27/04* (2013.01)

(58) Field of Classification Search
CPC ............................... H01G 4/012; H01G 4/228
See application file for complete search history.

(56) References Cited

U.S. PATENT DOCUMENTS

2006/0046377 A1* 3/2006 Koiwa .................. H01L 27/016 438/238
2009/0296312 A1* 12/2009 Ueda ........................ H01G 4/12 361/306.3
(Continued)

FOREIGN PATENT DOCUMENTS

CN   106024387 A   10/2016
EP   0788164 A1   8/1997
(Continued)

OTHER PUBLICATIONS

International Search Report issued for PCT/JP2017/037518, dated Jan. 16, 2018.
(Continued)

*Primary Examiner* — Evren Seven
(74) *Attorney, Agent, or Firm* — ArentFox Schiff LLP (57) ABSTRACT

A capacitor that includes a substrate having a first principal surface and a second principal surface, a lower electrode on the first principal surface, a dielectric film on the lower electrode, and an upper electrode on the dielectric film, wherein at least one of the lower electrode and the upper electrode has, in plan view of the first principal surface, a first region having a rectangular shape, and at least one second region protruding from at least one side of the first region.

15 Claims, 7 Drawing Sheets

(51) Int. Cl.
　　　*H01G 4/12*　　　(2006.01)
　　　*H01G 4/012*　　(2006.01)
　　　*H01L 21/822*　(2006.01)
　　　*H01L 27/04*　　(2006.01)

(56) References Cited

U.S. PATENT DOCUMENTS

2015/0325368 A1* 11/2015 Namikawa ............... H01G 2/10
　　　　　　　　　　　　　　　　　　　　　　　　　361/272
2016/0293334 A1　10/2016 Ehara et al.

FOREIGN PATENT DOCUMENTS

| | | |
|---|---|---|
| JP | H0689831 A | 3/1994 |
| JP | H09213908 A | 8/1997 |
| JP | 2008277425 A | 11/2008 |
| JP | 2015106612 A | 6/2015 |
| JP | 2015216246 A | 12/2015 |
| WO | 2006082817 A1 | 8/2006 |

OTHER PUBLICATIONS

Written Opinion of the International Searching Authority issued for PCT/JP2017/037518, dated Jan. 16, 2018.

* cited by examiner

CAPACITOR

CROSS REFERENCE TO RELATED APPLICATIONS

The present application is a continuation of International application No. PCT/JP2017/037518, filed Oct. 17, 2017, which claims priority to Japanese Patent Application No. 2016-215106, filed Nov. 2, 2016, the entire contents of each of which are incorporated herein by reference.

FIELD OF THE INVENTION

The present invention relates to a capacitor.

BACKGROUND OF THE INVENTION

As a representative capacitor element used in a semiconductor integrated circuit, for example, metal insulator metal (MIM) capacitor is widely known. MIM capacitor is a capacitor having a parallel flat plate type structure in which a dielectric is sandwiched between a lower electrode and an upper electrode.

For example, a capacitor such as the one described below is disclosed in Patent Document 1. The capacitor described in Patent Document 1 includes a lower electrode, a dielectric layer formed on the lower electrode, an upper electrode layer formed on the dielectric layer, and terminal electrodes connected to the upper electrode layer.

Patent Document 1: Japanese Patent Application Laid-Open No. 2015-216246

SUMMARY OF THE INVENTION

In the conventional capacitor described in Patent Document 1, the upper electrode and the lower electrode have a rectangular shape, therefore, when a film thickness is increased in order to reduce resistance of the upper electrode and the lower electrode, stress increases linearly along with film thickness. Accordingly, there has been a problem that a frequency element destruction increases, deteriorating reliability of the capacitor.

The present invention is made considering the above circumstance, and an object of the present invention is to reduce stress caused by the lower electrode and/or upper electrode.

A capacitor according to one aspect of the present invention includes a substrate having a first principal surface and a second principal surface, a lower electrode on the first principal surface, a dielectric film on the lower electrode, and an upper electrode on the dielectric film, wherein at least one of the lower electrode and the upper electrode has, in plan view of the first principal surface, a first region having a rectangular shape, and at least one second region protruding from at least one side of the first region.

According to the present invention, stress caused by the lower electrode and/or upper electrode can be reduced.

DETAILED DESCRIPTION OF THE INVENTION

Figure 1:
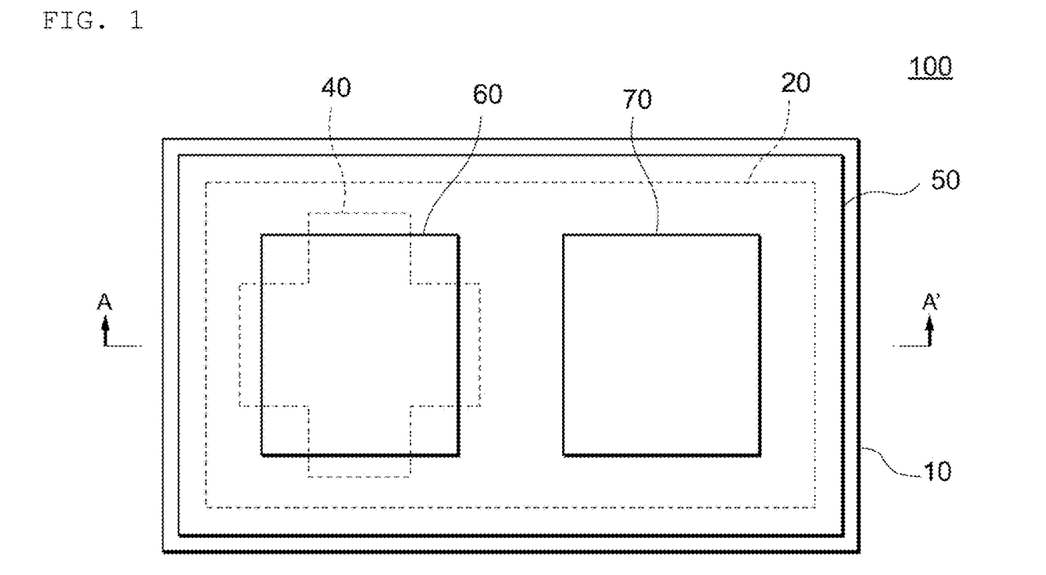
FIG. 1 is a plan view schematically showing a structure of a capacitor 100 according to one embodiment of the present invention.
Figure 2:
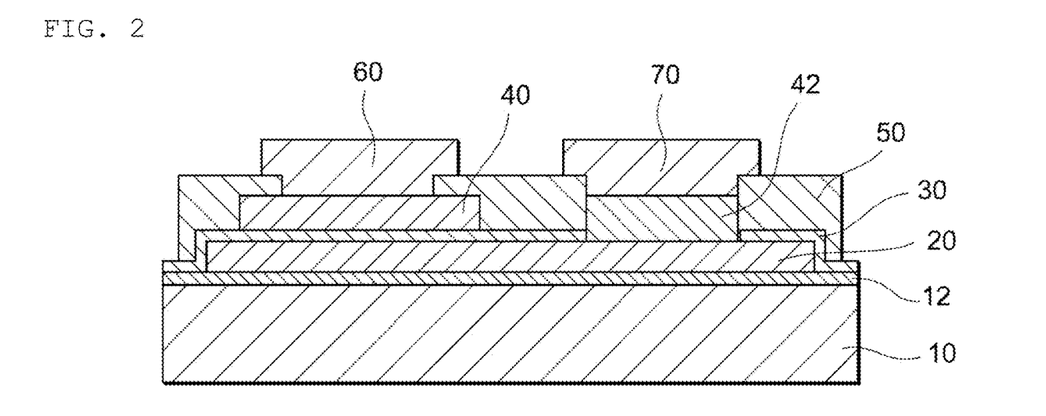
FIG. 2 is a view showing a cross section along AA' in FIG. 1.

FIG. 1 is a plan view schematically showing a structure of a capacitor 100 according to one embodiment of the present invention. Further, FIG. 2 is a view showing a cross section along AA' in FIG. 1. Note that in FIGS. 1 and 2, there are extracted and shown configurations that are only required for describing at least a part of characteristics in a structure in the capacitor 100, however, it does not inhibit the capacitor 100 to include an unillustrated configuration.

The capacitor 100 includes a substrate 10, an insulating film 12, a lower electrode 20, a dielectric film 30, and an upper electrode 40. Also, the capacitor 100 includes a via electrode 42 electrically connected to the lower electrode 20, a terminal electrode 70 electrically connected to the via electrode 42, and a terminal electrode 60 electrically connected to the upper electrode 40.

The substrate 10 has a front surface (an example of a first principal surface) on a side on which the lower electrode 20 is arranged, and a rear surface (an example of a second principal surface) on an opposite side to the front surface in the substrate 10. The substrate 10 has a rectangular shape in plan view of a front surface of the substrate 10 (That is, plan view of viewing the substrate 10 in a direction from the lower electrode 20 toward the substrate 10 (FIG. 1). Hereinafter, simply referred to as plan view.). The substrate 10 is, for example, a semiconductor substrate such as silicon. For example, the substrate 10 has a length in a long side of 200 µm to 600 µm, and a length in a short side of 100 µm to 300 µm.

The insulating film 12 is formed of, for example, silicon oxide. Moreover, the insulating film 12 is formed of material that comes into close contact with the substrate 10 formed under the insulating film 12 and the lower electrode 20 formed on the insulating film 12. The insulating film 12 may be a film formed of plural layers made of different materials. The insulating film 12 only needs to electrically insulate the substrate 10 and the lower electrode 20, and has a film thickness of, for example, about 0.5 µm to 3 µm. Further, the substrate 10 may be formed of insulating material such as alumina. In this case, the insulating film 12 may not be formed on the substrate 10.

The lower electrode 20 is formed in a region inside a peripheral edge of the substrate 10 in plan view, on an upper layer of the substrate 10. A shape of the lower electrode 20 in plan view is described later. A film thickness of the lower electrode 20 may be 0.3 µm to 10 µm, or may be 0.5 µm to 5 µm. As described above, by the lower electrode 20 having a relatively thick film thickness, series resistance can be reduced.

The lower electrode 20 is a metal made of copper, silver, gold, aluminum, nickel, chrome, titanium or the like, or a conductor containing the above metals. Also, the lower electrode 20 may be formed to have plural layers formed of different materials.

The dielectric film 30 is formed to cover a front surface of the lower electrode 20. Specifically, the dielectric film 30 is formed to cover an upper surface of the lower electrode 20 (that is, a surface that faces the upper electrode 40) and an end surface, and further has an opening through which the lower electrode 20 is exposed, at a position where the via electrode 42 is formed. The dielectric film 30 is formed of material having dielectric or insulating properties, that is, for example, oxides and nitrides including silicon oxide, silicon nitride, aluminum oxide, hafnium oxide, tantalum oxide, zirconium oxide and the like. A film thickness of the dielectric film 30 is, for example, 0.02 µm to 2 µm.

The upper electrode 40 is positioned on the dielectric film 30 inside a peripheral edge of the lower electrode 20 in plan view. In other words, the upper electrode 40 is positioned on the dielectric film 30 such that a whole of the upper electrode 40 overlaps with at least a part of the lower electrode 20 in plan view of the front surface of the substrate 10. A shape of the lower electrode 20 in plan view is described later. A film thickness of the upper electrode 40 may be 0.3 µm to 10 µm, or may be 0.5 µm to 5 µm. As described above, by the upper electrode 40 having a relatively thick film thickness, series resistance can be reduced.

The via electrode 42 is an electrode that is electrically connected to the lower electrode 20. The via electrode 42 is positioned, in plan view on an upper surface of the lower electrode 20, in a region excluding a partial region on which the upper electrode 40 is formed. Further, the via electrode 42 is formed to fill the opening formed in the dielectric film 30. In other words, the via electrode 42 is formed inside the opening to be in contact with the lower electrode 20. Alternatively, the via electrode 42 may be formed from the inside of the opening over the dielectric film 30 around a periphery of the opening.

In the present embodiment, the upper electrode 40 and the via electrode 42 are formed of the same material. The upper electrode 40 and the via electrode 42 are metals made of copper, silver, gold, aluminum, nickel, chrome, titanium or the like, or conductors containing the above metals.

A protective film 50 is formed to cover the upper electrode 40 and the via electrode 42. Also, the protective film 50 has openings through which the upper electrode 40 and the via electrode 42 are exposed respectively, at positions on which the terminal electrodes 60 and 70 are formed respectively. Further, the protective film 50 is formed to cover the dielectric film 30 and the insulating film 12 in a region outside the lower electrode 20 in plan view and is formed in a region inside the peripheral edge of the substrate 10. The protective film 50 is formed of, for example, insulating material such as polyimide resin or silicon oxide. Also, a film thickness of the protective film 50 is, for example, 1 µm to 20 µm.

The terminal electrode 60 is formed on the upper electrode 40 and the protective film 50 and is a terminal for electrically connecting the upper electrode 40 with the outside. In the present embodiment, the terminal electrode 60 is formed to be directly connected with the upper electrode 40, however, another conductive film may be formed between the terminal electrode 60 and the upper electrode.

The terminal electrode 70 is formed on the protective film 50 and the via electrode 42 and is a terminal for electrically connecting the lower electrode 20 with the outside. The terminal electrode 60 and the terminal electrode 70 may be made of material having lower resistivity than those of the lower electrode 20 and the upper electrode 40, and are, for example, metal formed of copper, aluminum or the like. This allows lowering of resistance. Further, the terminal electrode 70 may further contain a metal film such as gold or tin on the front surface of the terminal electrode 70. A film thickness of the terminal electrode 60 and the terminal electrode 70 is, for example, 1 µm to 10 µm.

Figure 3:
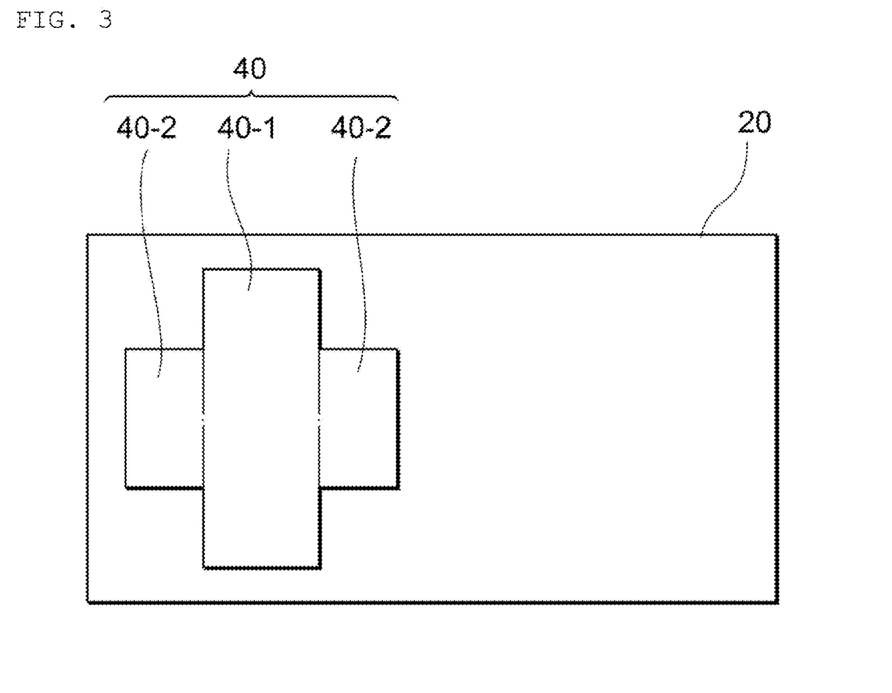
FIG. 3 is a view schematically showing shapes of a lower electrode 20 and an upper electrode 40 in plan view.

FIG. 3 is a view schematically showing shapes of the lower electrode 20 and the upper electrode 40 in plan view. In the present embodiment, the lower electrode 20 has a rectangular shape. Also, the upper electrode 40 includes a first region 40-1 having a rectangular shape and two second regions 40-2 continuing from the first region 40-1. Specifically, the first region 40-1 has two long sides and two short sides, and the two second regions 40-2 are provided continuingly from the region 40-1 respectively to protrude from a part of each of the two long sides of the region 40-1. Further, the two second regions 40-2 are provided so as to oppose each other on the opposite sides of the first region 40-1. In other words, in the present embodiment, the upper electrode 40 has a cross shape. Alternatively, the two second regions 40-2 may be provided at positions shifted from each other in a direction of the long side of the first region 40-1. As described above, because the upper electrode 40 has at least one second region 40-2 protruded from the first region 40-1, stress generated in the upper electrode 40 can be alleviated.

FIGS. 4A to 4F are schematic views each showing an example of a manufacturing method of the capacitor 100. Hereinafter, the manufacturing method of the capacitor 100 is described with reference to FIGS. 4A to 4F. Note that FIGS. 4A to 4F describe the manufacturing method for one capacitor 100, however, plural capacitors 100 can be formed simultaneously on the same substrate 10.

Figure 4A:
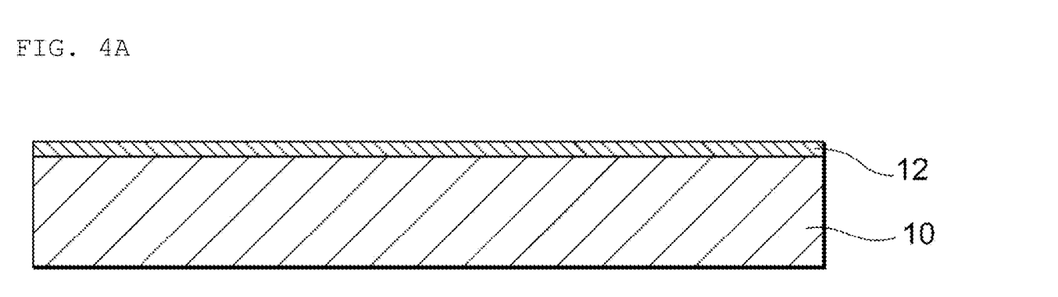
FIG. 4A is a schematic view showing an example of a manufacturing method of the capacitor 100.

As shown in FIG. 4A, firstly, the substrate 10 is prepared, and on the substrate 10, the insulating film 12 is formed. For example, the substrate 10 is a silicon substrate, and the insulating film 12 is a silicon oxide film formed by oxidizing the front surface of the silicon substrate. A thickness of the substrate 10 is, for example, 100 µm to 300 µm. By setting the thickness of the substrate 10 to 100 µm to 300 µm, mechanical strength of the substrate 10 can be retained and at the same time, a shape of the substrate 10 can be maintained to facilitate handing in mounting the capacitor 100. Note that the substrate 10 may be a different semiconductor substrate such as gallium arsenide, or may be insulating substrate such as glass or alumina. A film thickness of the insulating film 12 is, for example, 0.1 µm to 3 µm. However, the thickness of the insulating film 12 can be any thickness as long as the substrate 10 and the lower electrode 20 are kept insulated from each other. The insulating film 12 may be formed of insulating material such as silicon nitride or aluminum oxide.

Figure 4B:
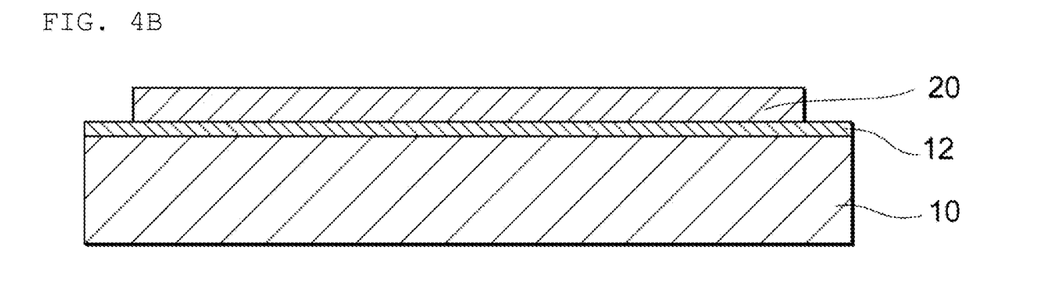
FIG. 4B is a schematic view showing an example of the manufacturing method of the capacitor 100.

Next, as shown in FIG. 4B, a metal film formed of metal material constituting the lower electrode 20 is formed on the insulating film 12, then the metal film is subjected to patterning using a photoresist and is etched by using the photoresist as a mask, forming the lower electrode 20. The metal material is, for example, copper, silver, gold, aluminum or the like. A film thickness of the lower electrode 20 is, for example, 0.5 µm to 10 µm, or may be 2 µm to 6 µm. By setting the film thickness of the lower electrode 20 to 0.5 µm to 10 µm, a resistance value of the lower electrode 20 can be suppressed to a degree not affecting high frequency characteristics of the capacitor 100, and further, stress generated by the lower electrode 20 can be suppressed to a degree not deforming the capacitor 100.

Figure 4C:
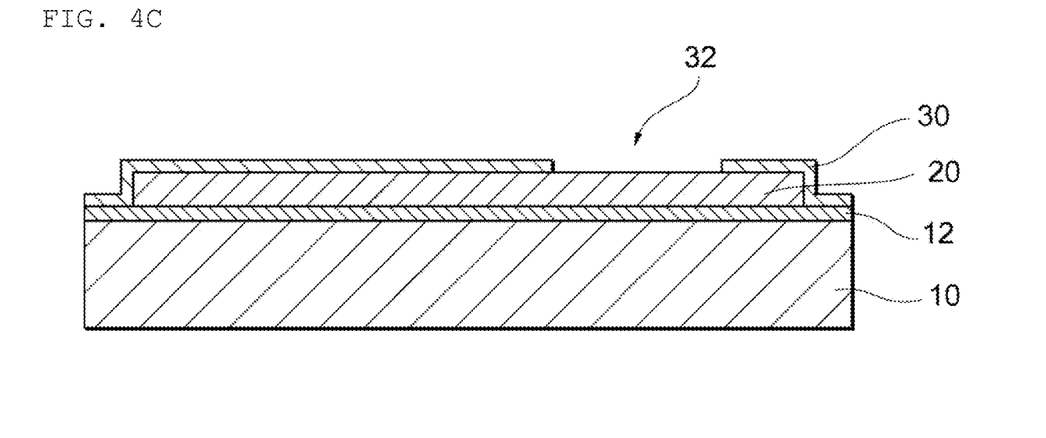
FIG. 4C is a schematic view showing an example of the manufacturing method of the capacitor 100.

Next, as shown in FIG. 4C, the dielectric film 30 is formed. Dielectric material for forming the dielectric film 30 is first deposited on upper and end surfaces of the lower electrode 20, and further on the insulating film 12. The dielectric material is, for example, a silicon nitride film whose film thickness is, for example, 0.1 µm to 1.5 µm. Thereafter, by using a patterned photoresist as a mask, a part of the dielectric material is removed such that a part of the upper surface of the lower electrode 20 is exposed to form an opening 32, and thus the dielectric film 30 is formed. The dielectric film 30 may be formed of dielectric material including other oxides and nitrides such as silicon oxide, aluminum oxide, hafnium oxide, or tantalum oxide.

Figure 4D:
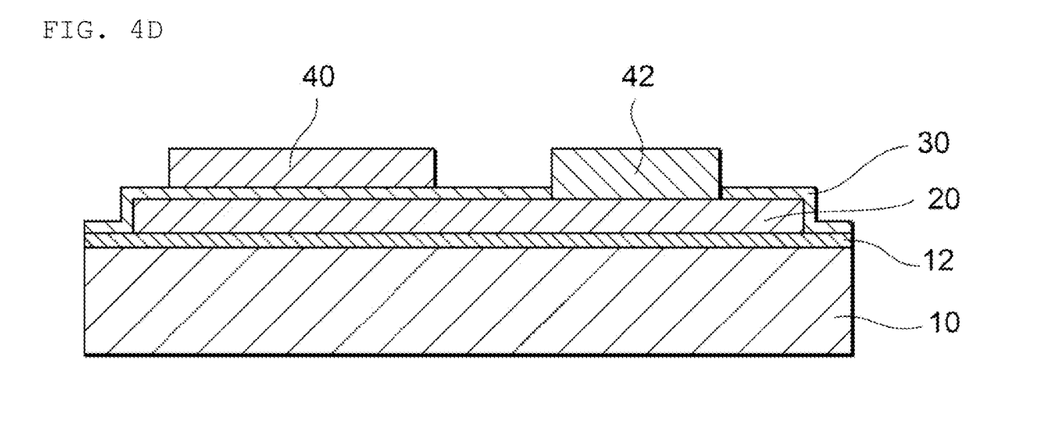
FIG. 4D is a schematic view showing an example of the manufacturing method of the capacitor 100.

Next, as shown in FIG. 4D, the upper electrode 40 and the via electrode 42 are formed. First, metal material for forming the upper electrode 40 and the via electrode 42 is deposited on the dielectric film 30 and the insulating film 12, and in the opening 32 of the dielectric film 30 (see FIG. 4C). A thickness of the upper electrode 40 and the via electrode 42 is, for example, 0.5 µm to 10 µm, and may be 2 µm to 6 µm. As described above, by the upper electrode 40 having a relatively thick film thickness, series resistance can be reduced. Further, the metal material is, for example, copper, silver, gold, aluminum or the like. Thereafter, by using a patterned photoresist as a mask, the deposited metal material is etched, thereby forming the upper electrode 40 in a partial region of the lower electrode 20, and meanwhile, forming the via electrode 42 in the opening 32 of the dielectric film 30.

Note that in the present embodiment, the lower electrode 20 is formed such that the film thickness is larger than that of the upper electrode 40. With this configuration, even when the upper electrode 40 is formed on the inner side of the lower electrode 20 in plan view, equivalent series resistance can be suppressed low.

Figure 4E:
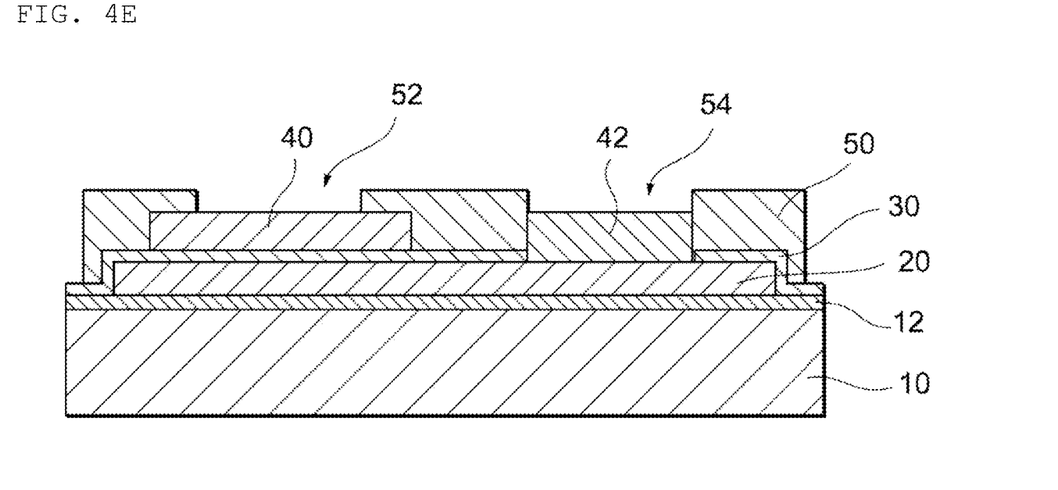
FIG. 4E is a schematic view showing an example of the manufacturing method of the capacitor 100.

Next, as shown in FIG. 4E, the protective film 50 is formed. First, insulating material for forming the protective film 50 is deposited on the upper electrode 40, the via electrode 42, the dielectric film 30, and the insulating film 12. The protective film 50 is formed of insulating material such as polyimide resin or silicon oxide. A film thickness of the protective film 50 is, for example, 1 µm to 20 µm. With this configuration, capacitance generated between the lower electrode 20 and the terminal electrode 60 with the protective film 50 interposed therebetween, can be made larger than capacitance generated between the lower electrode 20 and the upper electrode 40 with the dielectric film 30 interposed therebetween. Further, the material for forming the protective film 50 need not necessarily be highly viscous material, therefore, a thickness of the protective film 50 can be controlled relatively easily. Consequently, fluctuation in capacitance of the capacitor 100 can be reduced.

Thereafter, by using a patterned photoresist as a mask, the insulating material is etched to form openings 52 and 54 such that a part of the upper electrode 40 and a part of the via electrode 42 are exposed. Note that in the present embodiment, the protective film 50 is formed to cover side wall portions (side surfaces) of the lower electrode 20. With this configuration, even if the dielectric film 30 is not sufficiently formed at the side wall portions of the lower electrode 20, the lower electrode 20 is prevented from being exposed. Consequently, in mounting the capacitor 100, the lower electrode 20 can be prevented from being short circuited with solder at the side wall portions of the lower electrode 20.

Figure 4F:
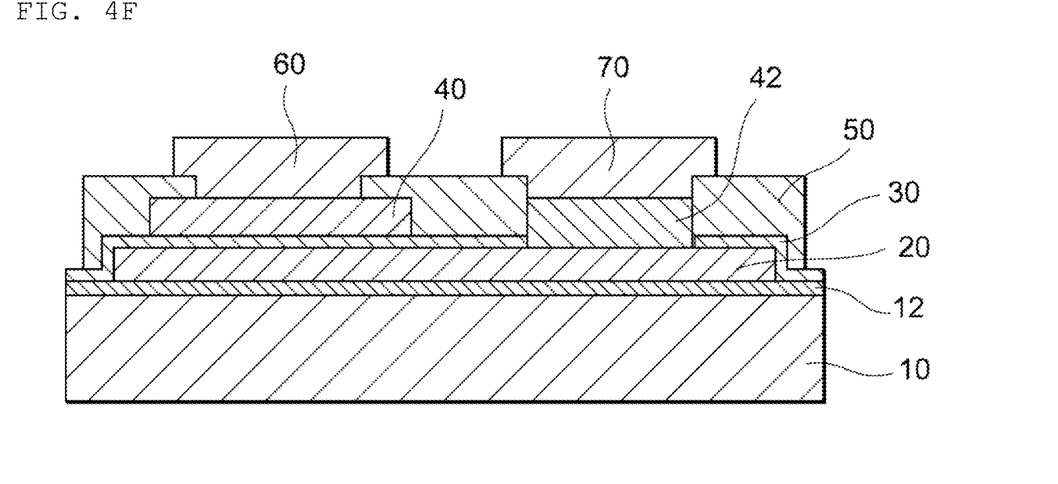
FIG. 4F is a schematic view showing an example of the manufacturing method of the capacitor 100.

Next, as shown in FIG. 4F, metal material is deposited on the openings 52 and 54 (see FIG. 4E) and the protective film 50, and is etched by using a patterned photoresist as a mask, to thereby form the terminal electrodes 60 and 70. The metal material is, for example, copper or aluminum, and may also be an alloy of nickel and gold and the like. Here, the metal material is deposited by sputtering or plating. According to the above steps, the capacitor 100 of the present embodiment can be obtained.

FIGS. 5 to 12 are views each showing other embodiments of the capacitor 100. Specifically, FIGS. 5 to 12 respectively show examples of shapes of lower electrodes 20 and upper electrodes 40 in plan view. In the embodiments described below, descriptions are omitted for contents that are common with the embodiment described with reference to FIGS. 1 to 4, and contents that are different are only described. In particular, comments are not made in each embodiment regarding similar effects with similar configurations.

Figure 5:
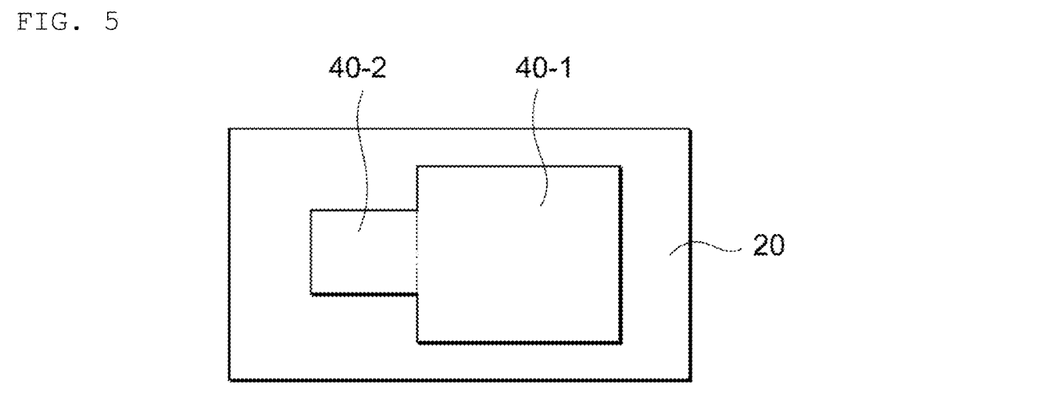
FIG. 5 is a view showing another embodiment of the capacitor 100.
Figure 6:
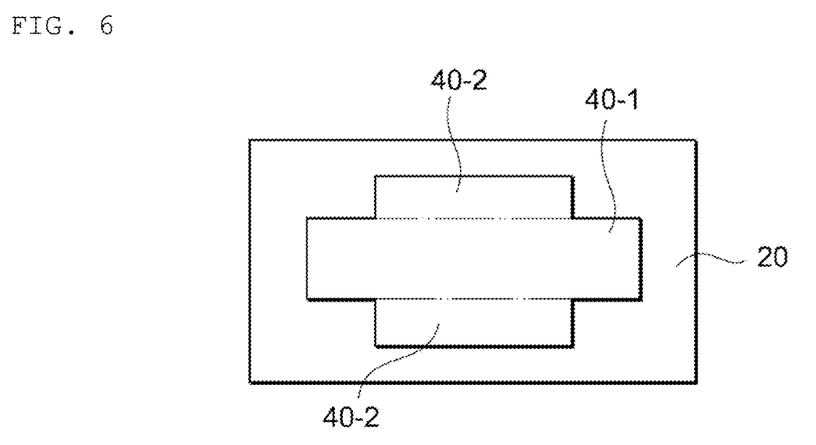
FIG. 6 is a view showing another embodiment of the capacitor 100.
Figure 7:
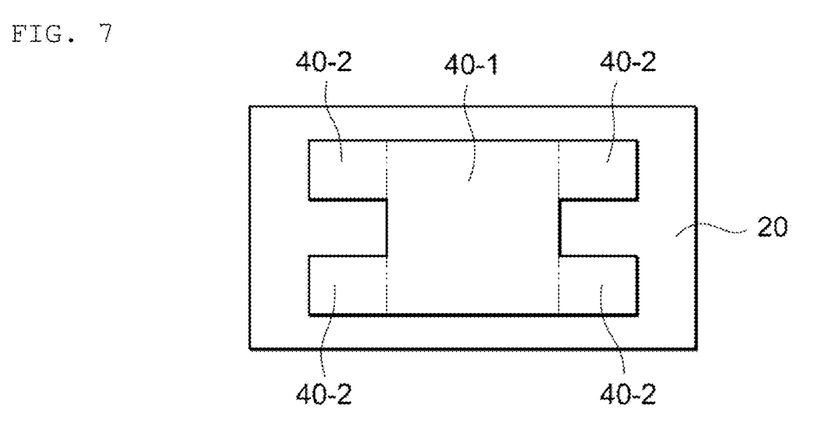
FIG. 7 is a view showing another embodiment of the capacitor 100.

In each of the examples shown in FIGS. 5 to 7, a lower electrode 20 has a rectangular shape. Moreover, in these examples, an upper electrode 40 includes a first region 40-1 having a rectangular shape and one or more second regions 40-2 protruding from the first region 40-1. As shown in each example, each of the second regions 40-2 may be provided by being protruded from any side of the first region 40-1, and a position of each of the second regions may also be at any position along the side (for example, a center part or end part). Further, as shown in FIG. 7, regarding one side of the first region 40-1, there may be plural numbers of the second regions 40-2 protruding from one side of the first region 40-1, such that the first region 40-1 and the second regions 40-2 form a recessed part or the like.

In each of the examples shown in FIGS. 8 to 11, a lower electrode 20 includes a first region 20-1 having a rectangular shape and at least one second region 20-2 continuing from the first region 20-1. On the other hand, an upper electrode 40 has a rectangular shape. As shown in each of the examples, the second region 20-2 of the lower electrode 20 may be provided by being protruded from any side of the first region 20-1, and a position of the second region may also be at any position along the side (for example, a center part, end part or the like). Further, there may be plural numbers of the second regions 20-2 protruding from one side of the first region 20-1.

Figure 8:
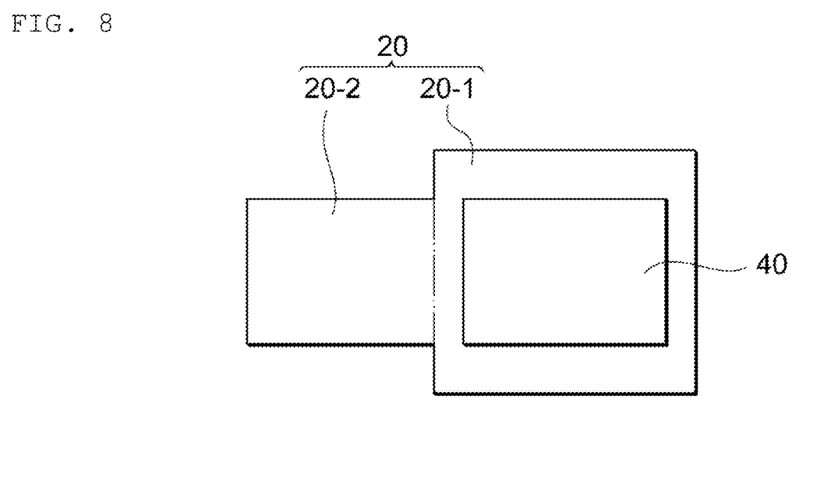
FIG. 8 is a view showing another embodiment of the capacitor 100.
Figure 9:
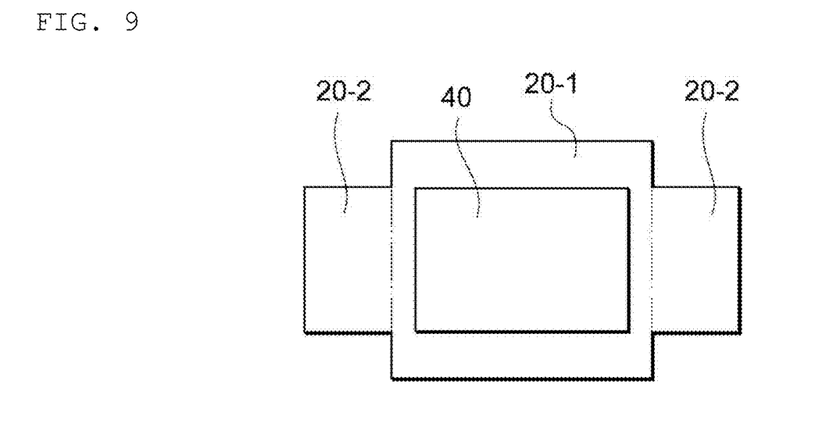
FIG. 9 is a view showing another embodiment of the capacitor 100.
Figure 10:
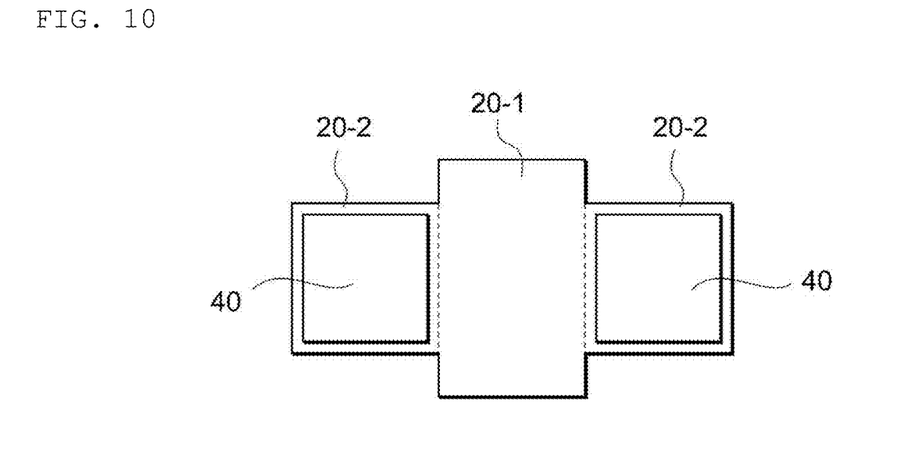
FIG. 10 is a view showing another embodiment of the capacitor 100.
Figure 11:
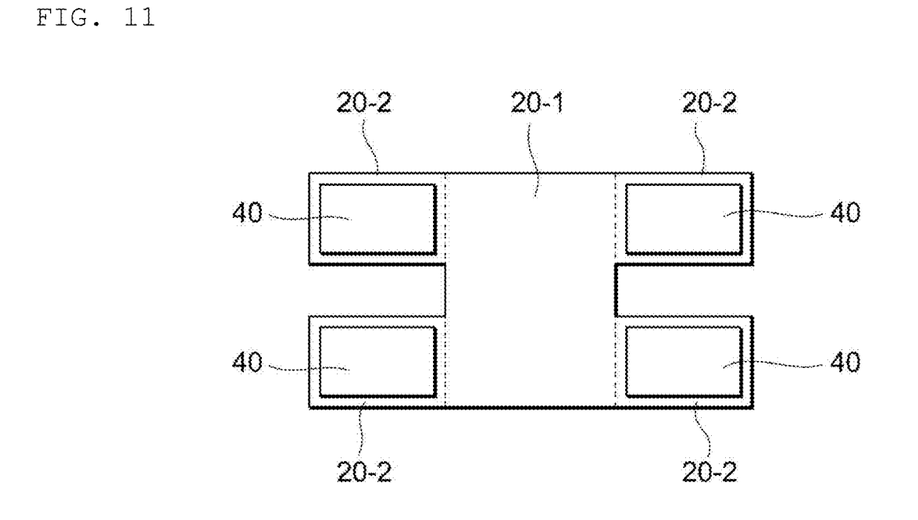
FIG. 11 is a view showing another embodiment of the capacitor 100.

In each of the examples shown in FIGS. 8 and 9, the upper electrode 40 is positioned inside the first region 20-1 of the lower electrode 20. Also, in each of the examples shown in FIGS. 10 and 11, the upper electrodes 40 are positioned inside the second regions 20-2 of the lower electrode 20, respectively (that is, the upper electrode 40 is divided into plural pieces). Specifically, by positioning each of the upper electrodes 40 inside each of the second regions 20-2 of the lower electrode 20, parasitic capacitance generated between the terminal electrodes 60 and 70 and the lower electrode 20 can be reduced.

Figure 12:
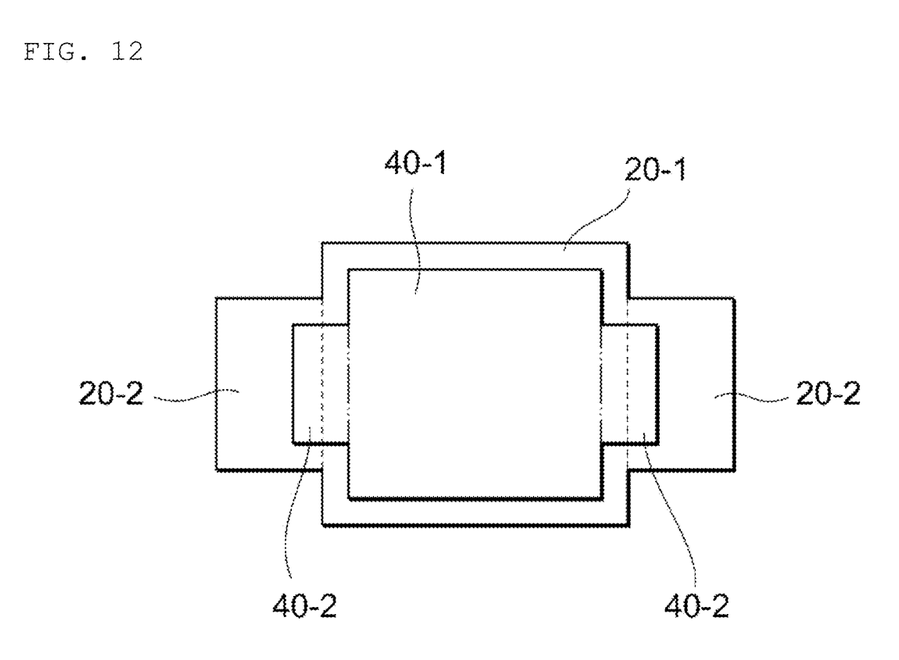
FIG. 12 is a view showing another embodiment of the capacitor 100.

In the example shown in FIG. 12, both of a lower electrode 20 and an upper electrode 40 include first regions 20-1 and 40-1 respectively, and further include at least one second region 20-2 and at least one second region 40-2 respectively protruding from at least one side of the respective above first regions. As shown in FIG. 12, the upper electrode 40 may be provided from the first region 20-1 over the second region 20-2 of the lower electrode 20 and may also be provided inside the first region 20-1 of the lower electrode 20.

The exemplary embodiments of the present invention have been thus described.

The capacitor 100 according to one embodiment of the present invention includes the substrate 10 having the front surface and the rear surface, the lower electrode 20 provided on the front surface, the dielectric film 30 provided on the lower electrode 20, and the upper electrode 40 provided on the dielectric film 30, wherein at least one of the lower electrode 20 and the upper electrode 40 has, in plan view of the front surface of the substrate 10, the first region 20-1 and/or 40-1 having a rectangular shape, and the at least one second region 20-2 and/or 40-2 protruding from at least one side of the first region 20-1 and/or 40-1. With this configuration, stress caused by the lower electrode 20 and/or the upper electrode 40 between the lower electrode 20 and/or upper electrode 40, and the protective film 50 and the dielectric film 30 can be reduced. Consequently, even when the film thickness of the lower electrode 20 and/or upper electrode 40 is made thick, element destruction caused by the stress can be reduced, and accordingly, lowering in reliability of the capacitor 100 can be suppressed. Note that the second region 20-2 and/or 40-2 may have a rectangular shape, and further, may have any shape including triangular and sector shapes, as long as the stress generated by the lower electrode 20 and/or upper electrode 40 can be reduced.

Further, the upper electrode 40 may be positioned inside the lower electrode 20 in plan view. Still further, the lower electrode 20 may include the first region 20-1 and second region 20-2, and the upper electrode 40 may be positioned inside the second region 20-2 in plan view. With this configuration, capacitance generated between the lower electrode 20 and the terminal electrode 60 can be reduced.

Note that each of the above described embodiments only facilitates understanding of the present invention and does not limit the interpretation of the present invention. The present invention can be changed and modified without departing from the purpose of the invention, and the present invention also includes the equivalents. That is, any appropriate design changes made by a person skilled in the art in each of the embodiments are within the scope of the present invention, as long as the changes include features of the present invention. For example, each constitutional component, and position, material, condition, shape, size and the like of the component included in each of the embodiments are not limited to those exemplified, but can be changed appropriately. Additionally, each of the embodiments is merely an example, and it is obvious that partial replacement or combination with the configuration shown in other embodiments can be made, which are also within the scope of the invention as long as these include the features of the present invention.

DESCRIPTION OF REFERENCE SYMBOLS

10: substrate
12: insulating film
20: lower electrode
20-1: first region
20-2: second region
30: dielectric film
40: upper electrode
40-1: first region
40-2: second region
42: via electrode
50: protective film
60: terminal electrode
70: terminal electrode
100: capacitor

The invention claimed is:

1. A capacitor comprising:
a substrate including a first principal surface and a second principal surface;
a lower electrode on the first principal surface;
a dielectric film on the lower electrode; and
an upper electrode on the dielectric film,
wherein at least one of the lower electrode and the upper electrode has, in a plan view of the first principal surface, a first region having a rectangular shape, and at least one second region protruding from at least one side of the first region, and wherein the at least one second region has a first length that is shorter than a second length of the at least one side of the first region from which the at least one second region protrudes, and a perimeter of the first region and the at least one second region in the plan view defines an entirety of the at least one of the lower electrode and the upper electrode.

2. The capacitor according to claim 1, wherein the at least one second region has a rectangular shape.

3. The capacitor according to claim 1, wherein the upper electrode is positioned inside a peripheral edge of the lower electrode in the plan view of the first principal surface.

4. The capacitor according to claim 1, further comprising an insulating film between the substrate and the lower electrode.

5. The capacitor according to claim 1, wherein the upper electrode has the first region and the at least one second region.

6. The capacitor according to claim 5, wherein the upper electrode includes two second regions that extend from opposed sides of the first region.

7. The capacitor according to claim 5, wherein the upper electrode includes two second regions that extend from the same side of the first region.

8. The capacitor according to claim 5, wherein the upper electrode includes four second regions, wherein a first pair and a second pair of the four second regions extend from opposed sides of the first region.

9. The capacitor according to claim 1, wherein the lower electrode has a larger thickness than that of the upper electrode.

10. The capacitor according to claim 1, wherein
the lower electrode has the first region and the second region, and
the upper electrode is positioned inside the second region in the plan view of the first principal surface.

11. The capacitor according to claim 1, wherein
the lower electrode has the first region and the second region, and
the upper electrode is positioned inside the first region in the plan view of the first principal surface.

12. The capacitor according to claim 1, wherein
the both the lower electrode and the upper electrode have the first region and the second region, and
the first region and the second region of the upper electrode are positioned inside the first region and the second region of the lower electrode, respectively, in the plan view of the first principal surface.

13. The capacitor according to claim 1, further comprising a via electrode electrically connected to the lower electrode.

14. The capacitor according to claim 13, further comprising a protective film covering portions of the upper electrode and the via electrode.

15. The capacitor according to claim 13, further comprising a first terminal electrode electrically connected to the upper electrode and a second terminal electrode electrically connected to the via electrode.

\* \* \* \* \*